United States Patent [19]

McAlister et al.

[11] Patent Number: 4,578,601
[45] Date of Patent: Mar. 25, 1986

[54] HIGH SPEED TTL CLOCK INPUT BUFFER CIRCUIT WHICH MINIMIZES POWER AND PROVIDES CMOS LEVEL TRANSLATION

[75] Inventors: Doyle V. McAlister, Pflugerville, Tex.; Richard D. Crisp, Beaverton, Oreg.

[73] Assignee: Motorola, Inc., Schaumburg, Ill.

[21] Appl. No.: 559,070

[22] Filed: Dec. 7, 1983

[51] Int. Cl.[4] .......................................... H03K 19/096
[52] U.S. Cl. ..................... 307/475; 307/452; 307/481; 307/246; 307/269; 307/579
[58] Field of Search ............... 307/443, 448, 451–453, 307/475, 481, 482, 269, 270, 246, 579, 585

[56] References Cited

U.S. PATENT DOCUMENTS 4,048,518  9/1977  Koo ................................ 307/482 X
4,284,905  8/1981  Rosenzweig ...................... 307/482
4,379,974  4/1983  Plachno ........................... 307/269

Primary Examiner—Stanley D. Miller
Assistant Examiner—D. R. Hudspeth
Attorney, Agent, or Firm—Anthony J. Sarli, Jr.; Jeffrey Van Myers; Robert L. King

[57] ABSTRACT

A buffer circuit is provided for buffering an input clock signal having TTL voltage levels to provide an output clock signal having MOS voltage levels. A reference voltage portion provides an accurate bias voltage to a first node. A voltage translation portion is coupled between an input and the first node. An inverter portion has a first input connected to the first node, a second input for receiving the input clock signal, and an output for providing the output clock signal. A clamping portion is connected to the first node to minimize the bias voltage potential.

9 Claims, 2 Drawing Figures though specific N-channel and P-channel MOS transistors are shown, it should be apparent that buffer circuit 10 could be implemented by completely reversing the processing techniques (e.g.

HIGH SPEED TTL CLOCK INPUT BUFFER CIRCUIT WHICH MINIMIZES POWER AND PROVIDES CMOS LEVEL TRANSLATION

TECHNICAL FIELD

This invention relates generally to buffer circuits and, more particularly, to buffer circuits for receiving an input clock signal.

BACKGROUND ART

Clock input buffers which buffer a TTL level clock input signal into an MOS level clock output signal are commonly required in electronic circuits. A typical application is in high speed microprocessor circuits where both speed and power consumption are important considerations. Previous buffer circuits which provide a continuous clock signal commonly utilize inverters connected in series. Such circuits have several stages of delay and consume excessive power at TTL voltage levels. Other known clock buffer circuits which are relatively fast in speed have the disadvantage of excessive power consumption.

SUMMARY OF THE INVENTION

It is an object of the present invention to provide an improved clock input buffer circuit.

Another object of the present invention is to provide a clock input buffer circuit which consumes low power and quickly converts a TTL level clock signal to an MOS level clock signal.

In carrying out the above and other objects of the present invention, there is provided, in one form, a clock input buffer circuit which buffers an input clock signal having TTL voltage levels to an output clock signal having MOS voltage levels. A reference voltage portion provides a predetermined reference voltage to a first node. A clamping portion is connected to the first node for coupling a supply voltage terminal to the first node thereby clamping a maximum voltage to the node. A voltage translator is coupled between the first node and an input node for maintaining the first and input nodes at different voltage potentials. An inverter provides the output clock signal and has a first input connected to the input node and a second input connected to the first node.

The above and other objects, features and advantages of the present invention will be more clearly understood from the following detailed description taken in conjunction with the following drawings.

DETAILED DESCRIPTION OF THE PRESENT INVENTION

Figure 1:
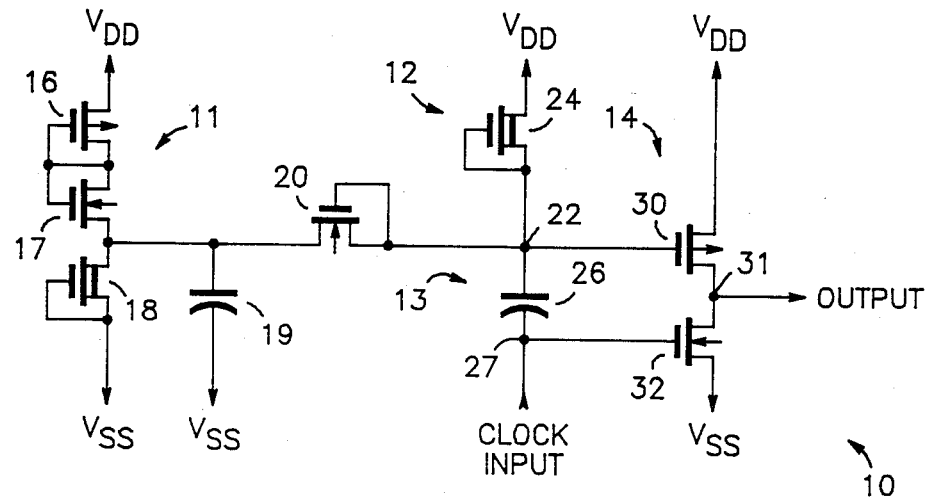
FIG. 1 illustrates in schematic form a clock input buffer circuit.

Shown in FIG. 1 is a clock input buffer circuit 10 generally having a reference voltage portion 11, a clamping portion 12, a voltage translation portion 13, and an inverter portion 14. Although specific N-channel and P-channel MOS transistors are shown, it should be apparent that buffer circuit 10 could be implemented by completely reversing the processing techniques (e.g. P-channel to N-channel) or by using other types of transistors.

Reference voltage portion 11 comprises a P-channel transistor 16 having a source electrode connected to a power supply voltage, say $V_{DD}$. Both a gate electrode and a drain electrode of transitor 16 are connected together to both a drain electrode and a gate electrode of an N-channel transistor 17. A source electrode of transistor 17 is connected to both a drain electrode of a depletion type transistor 18 and to a first electrode of a capacitor 19. A gate electrode of depletion transistor 18 is connected to a source electrode thereof and to a second power supply voltage, say $V_{SS}$, which has a lower voltage potential than supply voltage $V_{DD}$. A second electrode of capacitor 19 is connected to supply voltage $V_{SS}$. An N-channel transistor 20 has a source electrode connected to the first electrode of capacitor 19, and both a gate electrode and a drain electrode connected together at a node 22.

Clamping portion 12 comprises a depletion type transistor 24 having a first current electrode connected to supply voltage $V_{DD}$. Both a gate electrode and a second current electrode of depletion transistor 24 are connected together at node 22.

Voltage translation portion 13 comprises a capacitor 26 having a first electrode connected to node 22 and a second electrode connected to a clock input terminal at node 27. In a preferred form, both capacitors 19 and 24 are MOS transistors fabricated as capacitive devices in a conventional manner.

Inverter portion 14 comprises a P-channel transistor 30 having a source electrode connected to supply voltage $V_{DD}$, a gate electrode connected to node 22, and a drain electrode connected to an output terminal at a node 31, for providing an output signal. An N-channel transistor 32 has a drain electrode connected to node 31, a gate electrode connected to node 27, and a source electrode connected to second supply voltage $V_{SS}$.

Figure 2:
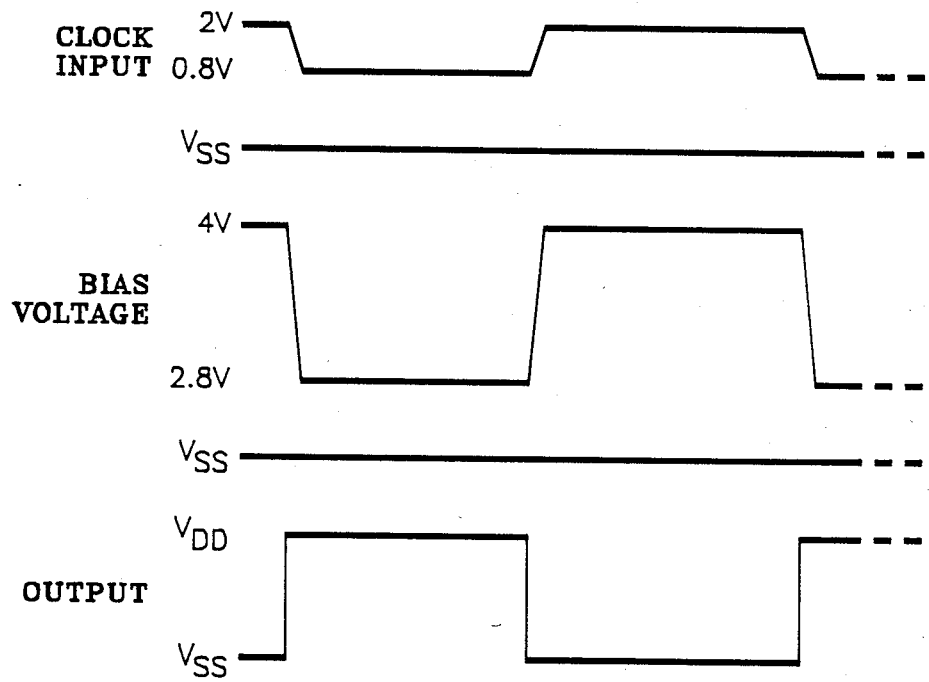
FIG. 2 illustrates in graphical form waveforms associated with the clock input buffer circuit of FIG. 1.

In operation, assume for the purpose of illustration only that a clock input signal shown in FIG. 2 is coupled to node 27. Capacitor 26 capacitively couples the input voltage to node 22 which is the gate electrode of transistor 30. The input voltage commonly has TTL voltage levels which vary between 0.8 volt and 2.0 volts. Reference voltage portion 11 performs a biasing function to place a bias voltage for transistor 30 at node 22 which is one P-channel threshold voltage ($V_{TP}$) below $V_{DD}$.

When the input voltage transitions to approximately 0.8 volt, transistor 30 is made strongly conductive. Conversely, when the input voltage is approximately 2.0 volts, transistor 30 is biased at approximately 4.0 volts to become nonconductive. The bias voltage at node 22 is illustrated in FIG. 2 as a function of the clock input signal. Capacitor 26 functions to translate the voltage between nodes 22 and 27. When the voltage at node 27 is at two volts, the voltage at node 22 is approximately four volts. The output voltage at node 31 is at $V_{SS}$ volts because transistor 30 is nonconductive and transistor 32 is conductive. When the voltage at node 27 changes to 0.8 volt, capacitor 26 directly couples voltage off of node 22 thereby making transistor 30 conductive and transistor 32 nonconductive. Therefore, the output voltage at node 31 is $V_{DD}$ volts.

Buffer circuit 10 requires a minimum frequency clock input to operate properly. If the clock input signal frequency is slowed down and the clock input is at a low TTL level of 0.8 volt, node 22 is initially at a voltage potential of approximately 2.8 volts. However, depletion transistor 24 would start charging node 22 to a potential of approximately 4.0 volts. Simultaneously, transistor 30 is made nonconductive. Since transistor 32 is already nonconductive, the output at node 31 varies in an indeterminate state.

Although the bias voltage of transistor 30 varies, it is important that the bias voltage of transistor 30 varies around a constant level. Capacitor 19 functions to help keep a constant voltage level at node 22 about which the bias voltage varies and also filters large voltage level changes. To prevent excessive loading of node 22, capacitor 19 is not connected directly to node 22 but rather to the drain electrode of transistor 20.

Reference voltage portion 11 biases the gate electrode of transistor 30 at an accurate reference voltage of $V_{DD}$ volts minus the threshold voltage of transistor 30. For illustration purposes only, the reference voltage is approximately four volts. Transistors 16, 17 and 18 are size ratioed so that the reference voltage at node 22 is one threshold voltage of transistor 30 below $V_{DD}$ volts. Transistor 16 reduces supply voltage $V_{DD}$ one P-channel threshold voltage at the drain electrode of transistor 17. The voltage at the source electrode of transistsor 17 is one N-channel threshold voltage less than the voltage at the drain electrode of transistor 17. Transistor 20 raises the voltage potential at the source electrode of transistor 17 one N-channel threshold voltage thereby making the reference voltage at node 22 equal to $V_{DD}$ minus one P-channel threshold. Transistor 20 functions to both isolate capacitor 19 from node 22 and accurately set the bias voltage of transistor 30.

Transistor 24 is a depletion transistor which functions as a clamping device to clamp the maximum voltage potential at node 22 to substantially $V_{DD}$ volts. In other words, if the clock input voltage should ever increase above typical TTL voltage levels or even slightly above $V_{DD}$ volts, transistor 24 functions to prevent the voltage at node 22 from increasing above $V_{DD}$. Also, when the voltage at node 22 becomes large enough to forward bias diode-connected transistor 20, transistor 20 and capacitor 19 help clamp node 22 at a level no greater than $V_{DD}$ by sourcing current from node 22 to suppy voltage $V_{SS}$. Transistor 30 will always be nonconductive when node 22 is at $V_{DD}$ volts and there is no benefit derived from the bias voltage ever increasing above $V_{DD}$ volts. Minimizing the voltage transitions on node 22 also helps minimize the conventional phenomena of latch up of buffer circuit 10 in general.

Inverter 14 functions as a conventional inverter which inverts the clock input signal while buffering the output voltage from TTL input levels to MOS output levels between $V_{DD}$ volts and $V_{SS}$ volts.

By now it should be apparent that a clock input buffer circuit having low power dissipation and minimal clock skew between voltage level transitions has been provided. Typical inverter circuits comprising two transistors of opposite conductivity type may dissipate power when both gate electrodes thereof are biased at a voltage such as two volts. This is because both transistors of the inverter are simultaneously conductive. However, in the present invention since the gate electrodes of transistors 30 and 32 are isolated from each other by capacitor 26, transistors 30 and 32 are not conductive at the same time, thereby conserving power. As a result, clock skew is also minimized. The clock input buffer is operational at high speed and is not extremely susceptible to the conventional latch up phenomena.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A clock input buffer circuit for buffering an input clock signal having TTL voltage levels to provide an output clock signal having MOS voltage levels, comprising:
   inverter means having first and second transistors of opposite conductivity type coupled between first and second power supply voltage terminals, the first transistor having a control electrode connected to a first node coupled to the input clock signal and having a predetermined threshold voltage, the second transistor having a control electrode connected to an input node also coupled to the input clock signal;
   reference voltage means for providing a predetermined bias voltage to the first node, said predetermined bias voltage differing from the first supply voltage by substantially the predetermined threshold voltage;
   means connected to the first node for coupling the first power supply voltage terminal to the first node, thereby limiting voltage at said first node to substantially within the first transistor threshold voltage of the first transistor of the inverter means; and
   voltage translation means coupled between the first node and the input node, for translating the input clock signal received at the input terminal to a proportional signal at the first node.

2. A clock input buffer circuit for buffering an input clock signal having TTL voltage levels to provide an output clock signal having MOS voltage levels, comprising:
   a first transistor of a first conductivity type having a first current electrode connected to a supply voltage terminal, and a second current electrode connected to a control electrode thereof;
   a second transistor of a second conductivity type having both a first current electrode and a control electrode connected to the second current electrode of the first transistor, and a second current electrode;
   a third transistor having a first current electrode connected to the second current electrode of the second transistor, and both a control electrode and a second current electrode connected to a reference voltage terminal;
   a first capacitor having a first electrode connected to the second current electrode of the second transistor, and a seocnd current electrode connected to the reference voltage terminal;
   a fourth transistor of the second conductivity type having a first current electrode connected to the first electrode of the first capacitor, and both a second current electrode and a control electrode connected to a first node;
   means connected to the first node for coupling a supply voltage terminal to the first node;
   a second capacitor coupled between the first node and an input node; and inverter means having a first input connected to the input node, a second input connected to the first node, and an output for providing the output clock signal.

3. The clock input buffer circuit of claim 2 wherein said third transistor is a depletion type transistor.

4. The clock input buffer circuit of claim 2 wherein said coupling means comprise:
a fifth transistor having a first current electrode connected to the supply voltage terminal, and both a control electrode and a second current electrode connected to the first node.

5. The clock input buffer circuit of claim 2 wherein said inverter means comprise:
a fifth transistor of the first conductivity type having a first current electrode connected to the supply voltage terminal, a control electrode connected to the first node, and a second current electrode connected to the output terminal; and
a sixth transistor of the second conductivity type having a first current electrode connected to the output terminal, a control electrode connected to the input terminal, and a second current electrode connected to the reference voltage terminal.

6. A clock input buffer circuit for buffering an input clock signal to provide an output clock signal having MOS voltage levels, comprising:
a first transistor of a first conductivity type having a first current electrode connected to the supply voltage terminal, and a second current electrode connected to a control electrode thereof;
a second transistor of a second conductivity type having both a first current electrode and a control electrode connected to the second current electrode of the first transistor, and a second current electrode;
a third transistor having a first current electrode connected to the second current electrode of the second transistor, and both a control electrode and a second current electrode connected to a reference voltage terminal;
a first capacitor having a first electrode connected to the second current electrode of the second transistor, and a second current electrode connected to the reference voltage terminal;
a fourth transistor of the second conductivity type having a first current electrode connected to the first electrode of the capacitor, and both a second current electrode and a control electrode connected to a first node;
a fifth transistor connected to the first node for clamping a maximum voltage potential to the first node;
a second capacitor connected between an input terminal for receiving the input clock signal and the first node, said second capacitor coupling the input terminal to the first node; and
inverter means having a first input connected to the first node, a second input connected to the input terminal, and an output for providing the output clock signal.

7. A clock input buffer circuit for buffering an input clock signal to provide an output clock signal having MOS voltage levels, comprising:
reference voltage means having size ratioed transistors for providing a predetermined bias voltage to a first node;
a first transistor connected to the first node for coupling a power supply voltage terminal to said first node;
a capacitor connected between an input terminal for receiving the input clock signal and the first node, said capacitor coupling the input terminal to the first node;
a second transistor of a first conductivity type having a first current electrode connected to the power supply voltage terminal, a control electrode connected to the first node, and a second current electrode connected to the output; and
a third transistor of a second conductivity type having a first current electrode connected to the output, a control electrode connected to the input terminal, and a second current electrode connected to a reference voltage terminal.

8. A clock input buffer circuit for buffering an input clock signal having TTL voltage levels to provide an output clock signal having MOS voltage levels, comprising:
a first transistor of a first conductivity type having a first current electrode connected to a supply voltage terminal, and a second current electrode connected to a control electrode thereof;
a second transistor of a second conductivity type having both a first current electrode and a control electrode connected to the second current electrode of the first transistor, and a second current electrode;
a third transistor being a depletion type transistor and having a first current electrode connected to the second current electrode of the second transistor, and both a control electrode and a second current electrode connected to a second supply voltage terminal;
a first capacitor having a first electrode connected to the second current electrode of the second transistor, and a second electrode connected to the second supply voltage potential;
a fourth transistor of the second conductivity type having a first current electrode connected to the first electrode of the capacitor, and both a second current electrode and a control electrode connected to a first node;
a fifth transistor being a depletion type transistor and having a first current electrode connected to the supply voltage terminal, and both a control electrode and a second current electrode connected to the first node;
a second capacitor having a first electrode connected to the first node, and a second electrode connected to an input terminal for receiving the input clock signal; and
inverter means having a first input connected to the input terminal, a second input connected to the first node, and an output for providing the output clock signal.

9. The clock input buffer circuit of claim 8 wherein said inverter means comprise:
a sixth transistor of the first conductivity type having a first current electrode connected to the supply voltage terminal, a second current electrode connected to the output, and a control electrode connected to the first node; and
a seventh transistor of the second conductivity type having a first current electrode connected to the output, a second current electrode connected to the second supply voltage terminal, and a control electrode connected to the input terminal.

* * * * *